United States Patent
Kumar et al.

(10) Patent No.: US 11,875,864 B2
(45) Date of Patent: Jan. 16, 2024

(54) MITIGATING EDGE LAYER EFFECT IN PARTIALLY WRITTEN BLOCKS

(71) Applicant: PetaIO Inc., Santa Clara, CA (US)

(72) Inventors: Naveen Kumar, San Jose, CA (US); Chengxu Zhang, NanJing (CN); Seok Lee, San Jose, CA (US); LingQi Zeng, San Jose, CA (US)

(73) Assignee: PETAIO INC., Santa Clara, CA (US)

(*) Notice: Subject to any disclaimer, the term of this patent is extended or adjusted under 35 U.S.C. 154(b) by 19 days.

(21) Appl. No.: 17/499,571

(22) Filed: Oct. 12, 2021

(65) Prior Publication Data
US 2023/0115979 A1   Apr. 13, 2023

(51) Int. Cl.
| | |
|---|---|
| G11C 16/34 | (2006.01) |
| G11C 16/10 | (2006.01) |
| G11C 29/42 | (2006.01) |
| G11C 16/28 | (2006.01) |
| G11C 16/06 | (2006.01) |

(52) U.S. Cl.
CPC .......... *G11C 16/3495* (2013.01); *G11C 16/06* (2013.01); *G11C 16/102* (2013.01); *G11C 16/28* (2013.01); *G11C 29/42* (2013.01)

(58) Field of Classification Search
CPC ... G11C 16/3495; G11C 16/102; G11C 16/16; G11C 16/28; G11C 29/42
See application file for complete search history.

(56) References Cited

U.S. PATENT DOCUMENTS

| | | | | |
|---|---|---|---|---|
| 10,048,863 | B1* | 8/2018 | Goss | G06F 3/0619 |
| 10,613,943 | B2* | 4/2020 | Guo | G06F 11/1458 |
| 11,275,528 | B2* | 3/2022 | Yu | G06F 3/0685 |
| 11,385,802 | B2* | 7/2022 | Sharon | G11C 16/3431 |
| 11,449,382 | B2* | 9/2022 | Oh | G11C 16/3436 |

* cited by examiner

*Primary Examiner* — Vanthu T Nguyen
(74) *Attorney, Agent, or Firm* — David R. Stevens; Stevens Law Group

(57) ABSTRACT

A storage device includes 3D NAND including layers of multi-level cells. When a shutdown command is received, whether a block is partially written is evaluated. If so, dummy lines are written after the last written wordline of the block. Partially written blocks may be those having a fill percentage less than a threshold. The threshold may be a function of the PEC count of the block. If a maximum retention time is exceeded by data stored in a partially written block, dummy lines may also be written to the block.

14 Claims, 8 Drawing Sheets

MITIGATING EDGE LAYER EFFECT IN PARTIALLY WRITTEN BLOCKS

BACKGROUND

Field of the Invention

This invention relates to systems and methods for retaining data stored in NAND storage devices.

Background of the Invention

The storage density of NAND storage devices continues to increase. Currently, three-dimensional (3D) NAND is available. 3D NAND includes many layers, such as up to 96 layers. Due to the high storage density and structure of these devices, reading and writing to one layer can affect data stored in another layer. Accordingly, approaches are needed to mitigate these effects and improve the retention of data within NAND storage devices.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION

Figure 1:
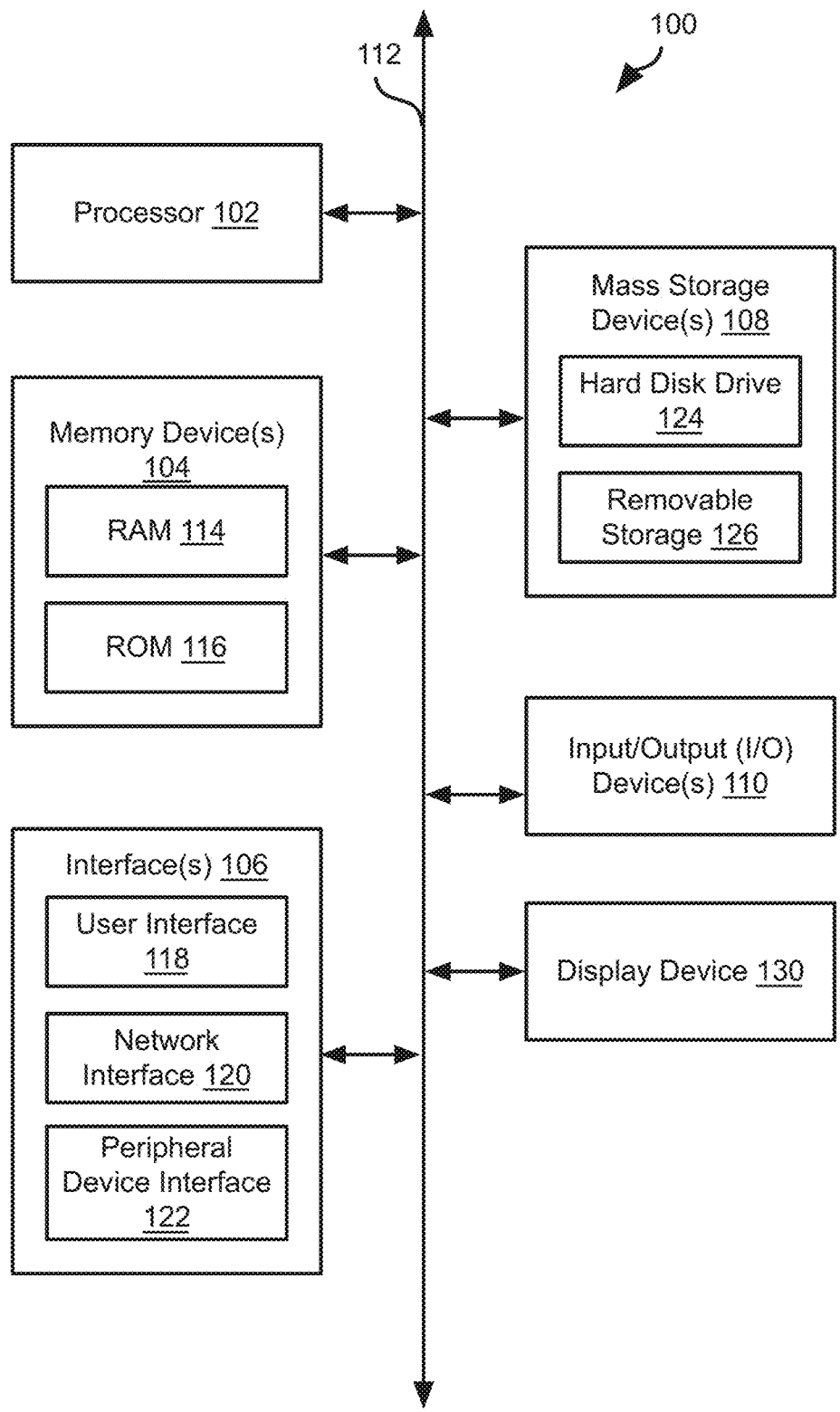
FIG. 1 is a schematic block diagram of a computing system suitable for implementing an approach in accordance with embodiments of the invention.

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

The invention has been developed in response to the present state of the art and, in particular, in response to the problems and needs in the art that have not yet been fully solved by currently available apparatus and methods.

Embodiments in accordance with the present invention may be embodied as an apparatus, method, or computer program product. Accordingly, the present invention may take the form of an entirely hardware embodiment, an entirely software embodiment (including firmware, resident software, micro-code, etc.), or an embodiment combining software and hardware aspects that may all generally be referred to herein as a "module" or "system." Furthermore, the present invention may take the form of a computer program product embodied in any tangible medium of expression having computer-usable program code embodied in the medium.

Any combination of one or more computer-usable or computer-readable media may be utilized. For example, a computer-readable medium may include one or more of a portable computer diskette, a hard disk, a random access memory (RAM) device, a read-only memory (ROM) device, an erasable programmable read-only memory (EPROM or flash memory) device, a portable compact disc read-only memory (CDROM), an optical storage device, and a magnetic storage device. In selected embodiments, a computer-readable medium may comprise any non-transitory medium that can contain, store, communicate, propagate, or transport the program for use by or in connection with the instruction execution system, apparatus, or device.

Computer program code for carrying out operations of the present invention may be written in any combination of one or more programming languages, including an object-oriented programming language such as Java, Smalltalk, C++, or the like and conventional procedural programming languages, such as the "C" programming language or similar programming languages. The program code may execute entirely on a computer system as a stand-alone software package.

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions or code. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a non-transitory computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

FIG. 1 is a block diagram illustrating an example computing device 100. Computing device 100 may be used to perform various procedures, such as those discussed herein. Computing device 100 can function as a server, a client, or any other computing entity. Computing device 100 can be any of a wide variety of computing devices, such as a desktop computer, a notebook computer, a server computer, a handheld computer, tablet computer and the like.

Computing device 100 includes one or more processor(s) 102, one or more memory device(s) 104, one or more interface(s) 106, one or more mass storage device(s) 108, one or more Input/Output (I/O) device(s) 110, and a display device 130 all of which are coupled to a bus 112. Processor(s) 102 include one or more processors or controllers that execute instructions stored in memory device(s) 104 and/or mass storage device(s) 108. Processor(s) 102 may also include various types of computer-readable media, such as cache memory.

Memory device(s) 104 include various computer-readable media, such as volatile memory (e.g., random access memory (RAM) 114) and/or nonvolatile memory (e.g., read-only memory (ROM) 116). memory device(s) 104 may also include rewritable ROM, such as flash memory.

Mass storage device(s) 108 include various computer readable media, such as magnetic tapes, magnetic disks, optical disks, solid-state memory (e.g., flash memory), and so forth. As shown in FIG. 1, a particular mass storage device is a hard disk drive 124. Various drives may also be included in mass storage device(s) 108 to enable reading from and/or writing to the various computer readable media. Mass storage device(s) 108 include removable media 126 and/or non-removable media.

I/O device(s) 110 include various devices that allow data and/or other information to be input to or retrieved from computing device 100. Example I/O device(s) 110 include cursor control devices, keyboards, keypads, microphones, monitors or other display devices, speakers, printers, network interface cards, modems, lenses, CCDs or other image capture devices, and the like.

Display device 130 includes any type of device capable of displaying information to one or more users of computing device 100. Examples of display device 130 include a monitor, display terminal, video projection device, and the like.

interface(s) 106 include various interfaces that allow computing device 100 to interact with other systems, devices, or computing environments. Example interface(s) 106 include any number of different network interfaces 120, such as interfaces to local area networks (LANs), wide area networks (WANs), wireless networks, and the Internet. Other interface(s) include user interface 118 and peripheral device interface 122. The interface(s) 106 may also include one or more user interface elements 118. The interface(s) 106 may also include one or more peripheral interfaces such as interfaces for printers, pointing devices (mice, track pad, etc.), keyboards, and the like.

Bus 112 allows processor(s) 102, memory device(s) 104, interface(s) 106, mass storage device(s) 108, and I/O device(s) 110 to communicate with one another, as well as other devices or components coupled to bus 112. Bus 112 represents one or more of several types of bus structures, such as a system bus, PCI bus, IEEE 1394 bus, USB bus, and so forth.

For purposes of illustration, programs and other executable program components are shown herein as discrete blocks, although it is understood that such programs and components may reside at various times in different storage components of computing device 100, and are executed by processor(s) 102. Alternatively, the systems and procedures described herein can be implemented in hardware, or a combination of hardware, software, and/or firmware. For example, one or more application specific integrated circuits (ASICs) can be programmed to carry out one or more of the systems and procedures described herein.

Figure 2:
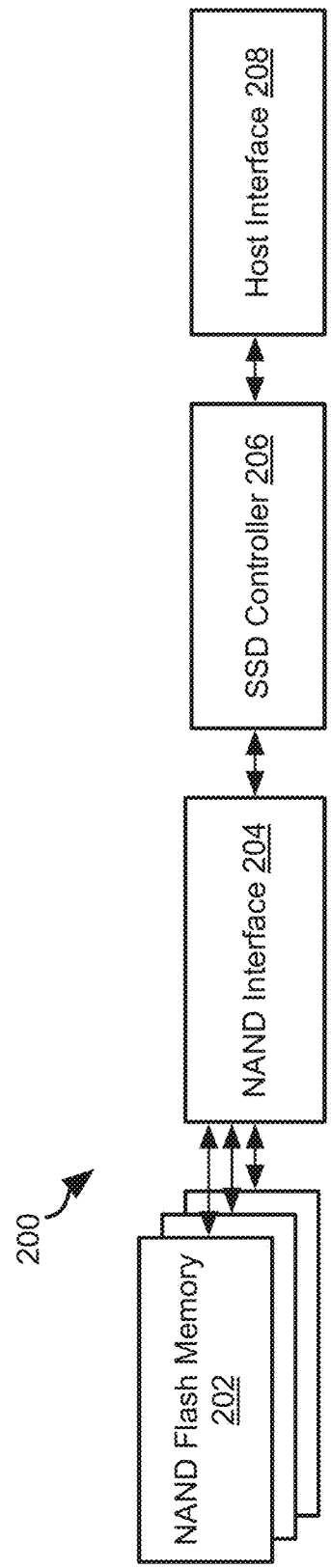
FIG. 2 is a schematic block diagram of components of a storage system that may implement an approach in accordance with an embodiment of the present invention.

Referring to FIG. 2, a typically flash storage system 200 includes a solid state drive (SSD) that may include a plurality of NAND flash memory devices 202. One or more NAND devices 202 may interface with a NAND interface 204 that interacts with an SSD controller 206. The SSD controller 206 may receive read and write instructions from a host interface 208 implemented on or for a host device, such as a device including some or all of the attributes of the computing device 100. The host interface 208 may be a data bus, memory controller, or other components of an input/output system of a computing device, such as the computing device 100 of FIG. 1.

The methods described below may be performed by the SSD controller 206, the host interface 208, or a combination of the two. The methods described herein may be executed by any component in such a storage device or be performed completely or partially by a host processor coupled to the storage device.

During a normal operation of the flash storage system, there are certain blocks which are partially written. Whenever a drive is requested to shut down due to normal or sudden power off, it is not known how much longer the drive will remain in the shutdown mode. If the drive remains in the shutdown mode for a long time, it is under long-term retention stress that can be detrimental to the data integrity of partially written blocks. The Joint Electron Device Engineering Council (JEDEC) standard for enterprise drives has a strict requirement of three months of retention at 40° C. at the maximum number of PECs allowed for the NAND storage device.

The system and method described below provides a firmware algorithm to mitigate a number of errors caused at the last written layers ("edge layers") of a partially written block in a NAND storage device when the block is subject to normal or sudden power off and during a long-term retention. The approach described below can significantly reduce the average and maximum number of errors observed in a partially written block undergoing a long-term retention stress and can further improve the data reliability in the NAND storage device.

Figure 3:
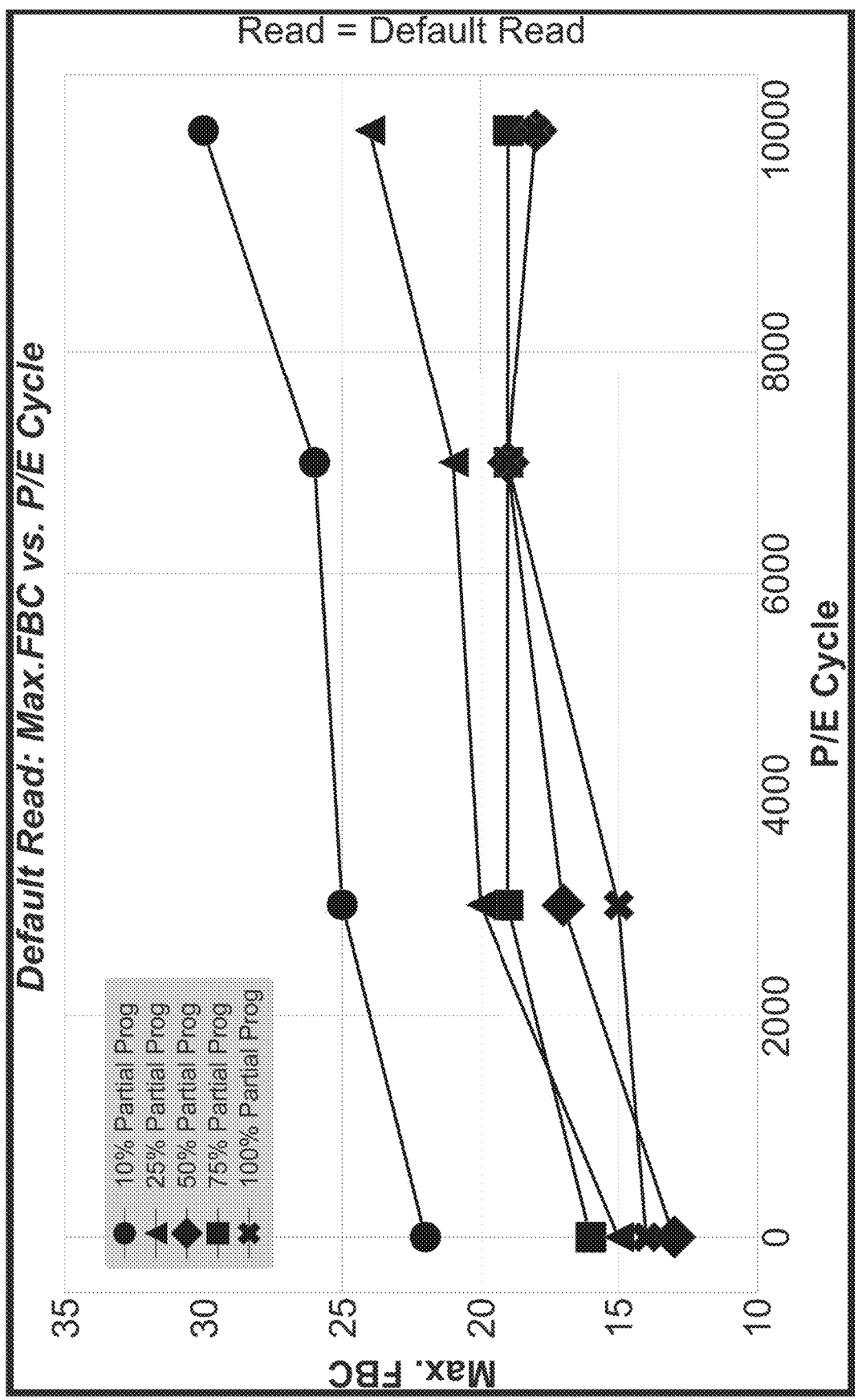
FIG. 3 is a plot showing the maximum failed bit counts (FBC) per wordline for a NAND device for various program erase cycle (PEC) counts and block fill percentages.
Figure 4A:
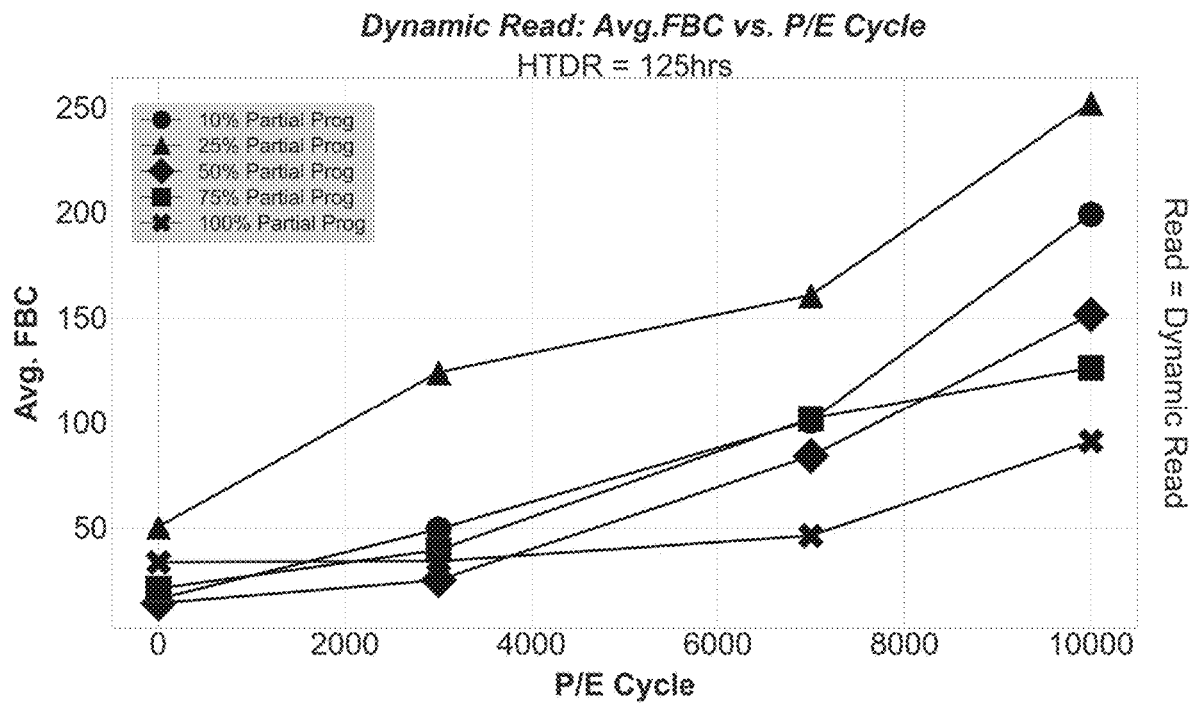
FIG. 4A is plot showing average FBCs for various PEC counts and block fill percentages after 125 hours of retention.
Figure 4B:
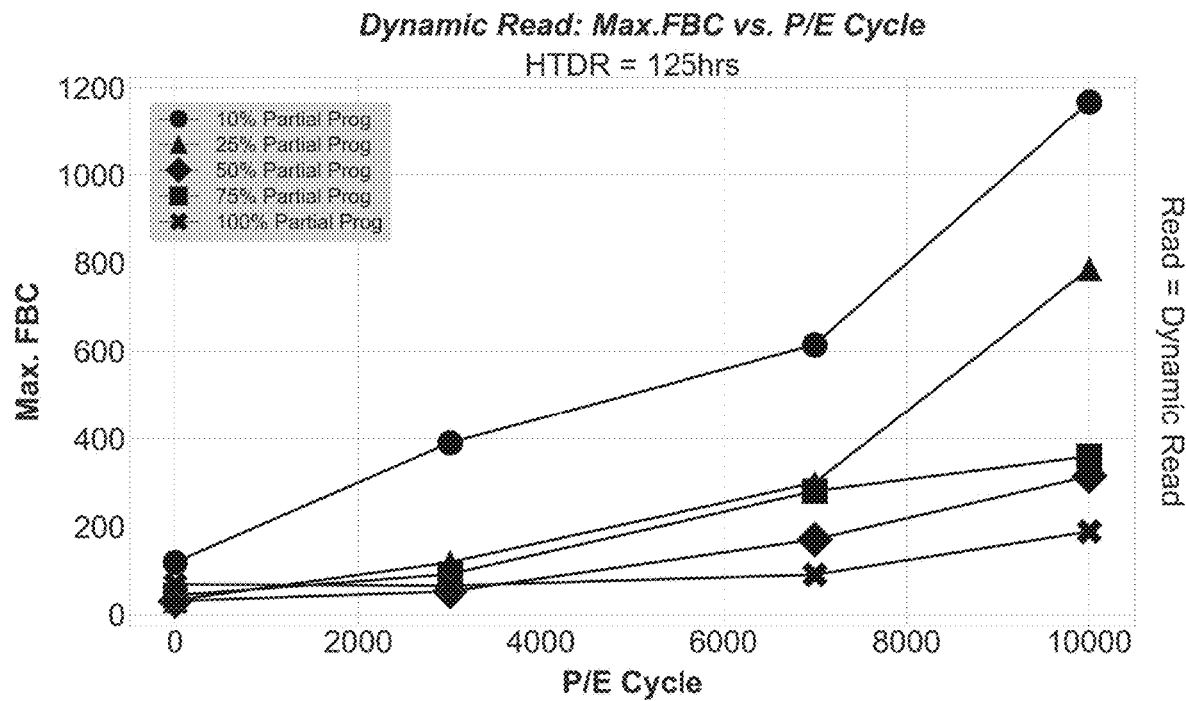
FIG. 4B is plot showing maximum FBCs for various PEC counts and block fill percentages after 125 hours of retention.

FIG. 3 and FIGS. 4A and 4B show error characteristic of a NAND storage device that is subject to program disturb and retention effect. FIG. 3 shows error characteristics of NAND wordlines resulting from the program disturb that occurs upon initial writing. FIGS. 4A and 4B illustrate high temperature data retention (HTDR) at a temperature of 66°

C. after a long retention time of 125 hours. The NAND storage device used for the measurements of FIGS. 4A and 4B was a 96 layer 3D NAND device. FIG. 4A shows the average number of FBCs per wordline at various PEC counts and fill percentages. FIG. 4B shows the maximum number of FBCs per wordline at various PEC counts and fill percentages.

As is readily apparent, as the program erase cycle (PEC) count increase, the size of failed bit counts (FBCs) increase for all of the situations represented in FIGS. 3, 4A, and 4B. As is also apparent, the size of FBCs also increase with decrease in the percentage of wordlines written, with a 10 percent partial program having the highest FBCs for all PEC counts in all situations represented in FIGS. 3, 4A, and 4B.

Figure 5:
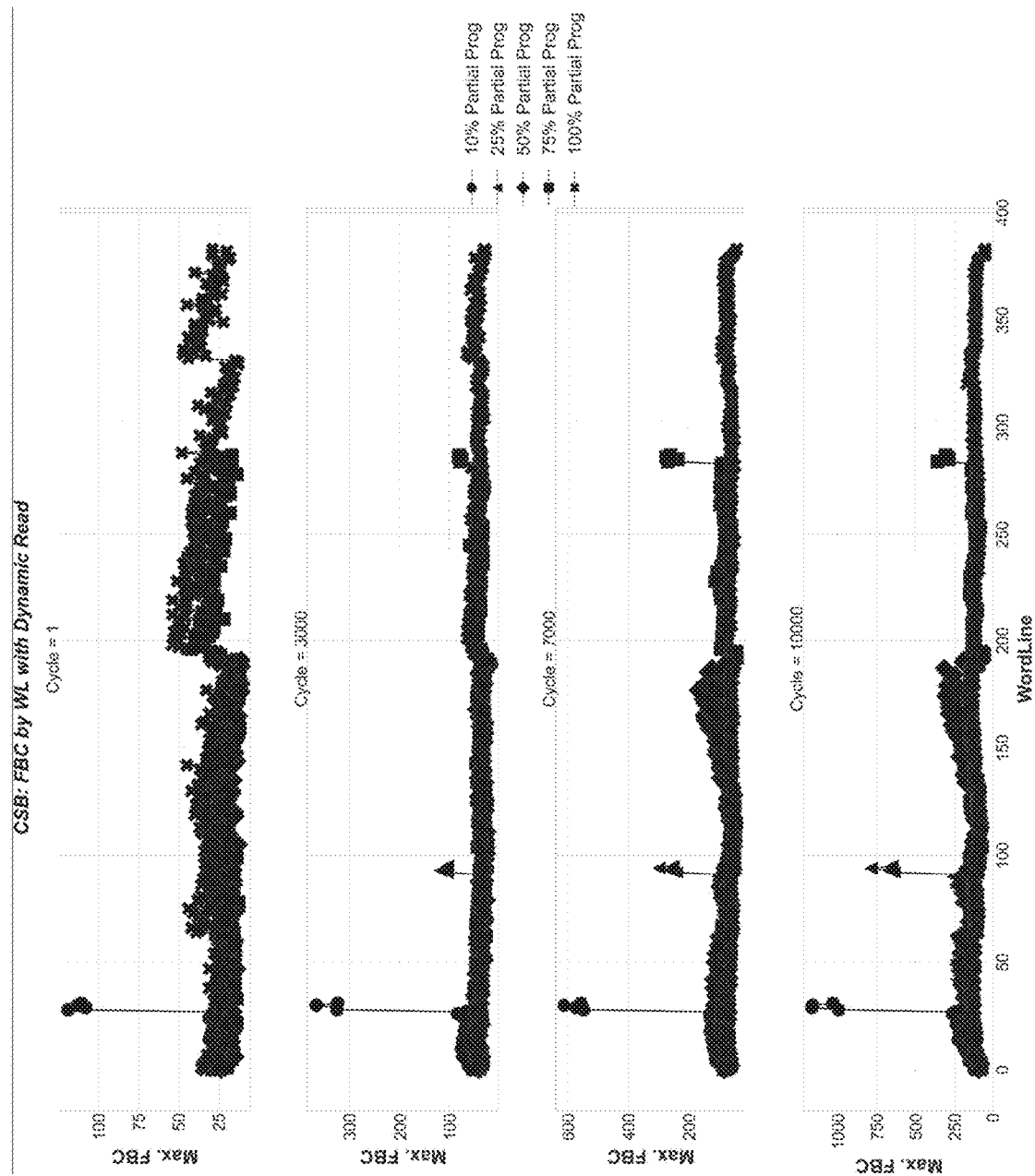
FIG. 5 is a plot showing maximum FBCs per wordline for various PEC counts and block fill percentages after 125 hours of retention.

FIG. 5 illustrates the maximum number of FBCs per wordline. Each plot represents measured values for a given PEC count ("Cycle") and includes plots of maximum FBCs for various fill percentages. The plots of FIG. 5 were measured after 125 hours of retention at a temperature of 66° C. For the plot of FIG. 5, the FBCs for the center significance bit (CSB) of a multi-level cell (MLC) NAND storage device were measured. In the illustrated plot, the horizontal axis represents the writing order of wordlines within the NAND storage device studied such that the order of writing of wordlines is from left to right as represented in FIG. 5.

As is apparent in FIG. 5, for the 10 percent fill percentage, there is a remarkable increase in the number of FBCs in the wordlines of the last layer written while other wordlines are relatively unaffected. In the illustrated embodiment, each layer includes four wordlines. Other NAND storage devices may have a different number of wordlines per layer, such as eight. Likewise, for the 25 percent fill percentage there is also a remarkable increase in FBCs for the last four wordlines written while other wordlines are relatively unaffected. As is also apparent, the disparity in FBCs for the last written wordlines is much less significant for the fill percentages of 50 percent and 75 percent. For a 100 percent fill percentage, there is no significant correspondence between FBC and the position of a wordline within the NAND storage device. FIGS. 5, 4A, and 4B as compared to FIG. 3 further show that the effect of retention time on FBCs is much worse than that resulting from program disturb.

Figure 6:
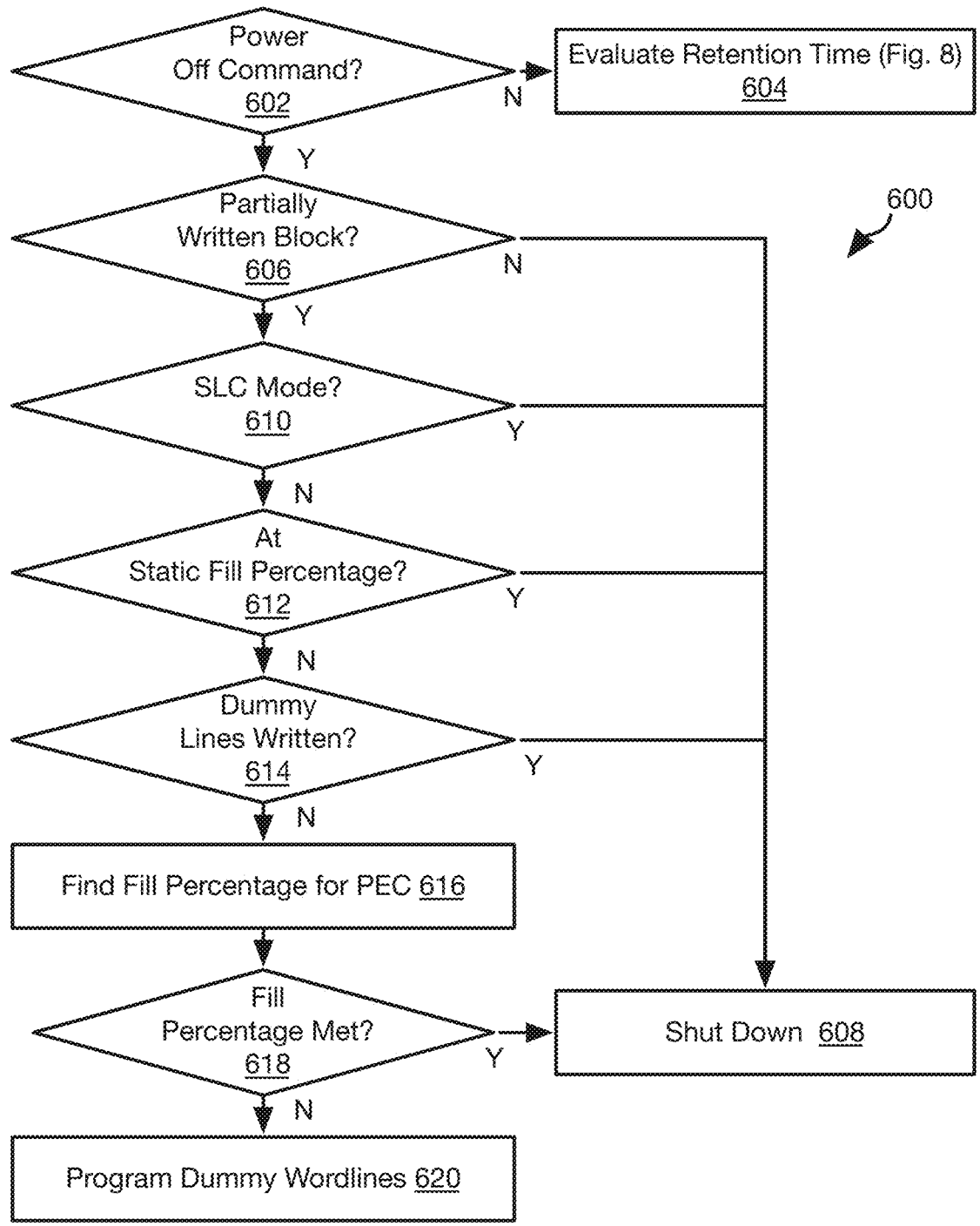
FIG. 6 is a process flow diagram illustrating a mitigation approach performed in response to shutdown commands in accordance with an embodiment of the present invention.

FIG. 6 illustrates a method 600 that may be performed with respect to a NAND flash memory 202 by the SSD controller 206, processing device 102, or other component of a computing device 100. The method 600 may include detecting 602 a power off command. The power off command may be intentional, i.e. in response to a shut off command received from a user or other legitimate source. The shut off command may be sudden, e.g., the result of loss of power, failure of another component of a computing device, or some other means.

In the absence of a power off command, the method 600 may include evaluating 604 retention time of data within the NAND flash memory 202 and mitigating errors resulting from partial writing due to extended retention times. Step 604 may include performing the method 800 of FIG. 8.

If a power off command is found 602 to have been received, the method 600 may include evaluating 606 whether one or more blocks of the NAND flash memory 202 is partially written. For example, for each block of the NAND flash memory 202, a bit may be set when any wordline of the block is written and then cleared when the block is either erased or is completely filled. Accordingly, any block with its corresponding bit set may be deemed to be partially written. If no blocks are found 606 to be partially written, the shutdown may be performed at step 608 without further mitigation according to the method 600. The remaining steps of the method 600 may be performed with respect to each block found 606 to be partially written, hereinafter referred to simply as "the block."

In some embodiments of the method 600, the mitigation according to the method 600 is also omitted if the block is found 610 to be a single level cell (SLC) block. In a single level cell, each cell only stores one bit. Such cells are less susceptible to edge layer errors and therefore mitigation may be omitted.

In some embodiments of the method 600, the mitigation according to the method 600 is also omitted if the block is found 612 to have a fill percentage at a static fill percentage specific to the NAND storage device storing the block. This threshold may be a static threshold that is independent of the PEC count of the block. For example, for a specific fill percentage, a NAND storage device of the NAND flash memory 202 is not susceptible to edge layer errors. This value is an artifact of the NAND storage device used. For example, for some NAND storage devices, a static fill percentage of 50 percent may be used. Other NAND storage devices may have different static fill percentages.

In some embodiments, mitigation according to the method 600 is omitted in cases where the block is found 614 to already have been subject to mitigation, e.g., writing of one or more dummy lines to the wordlines immediately following a last programmed wordline of the block. In particular, the dummy lines may be written to all wordlines of the layer following the last written layer of the block. Dummy lines may have been previously written in a previous iteration of the method 600 a last time the NAND flash memory 202 was shut down. Dummy lines may also have been previously written to improve long term retention in the absence of a shutdown command as described below with respect to FIG. 8. The previous writing of dummy lines to the block may be detected in various means. For example, for each block of the NAND flash memory 202, a mitigation bit may be maintained. This bit may be set whenever dummy lines are written to that block and its stored value evaluated to determine whether the block is partially written. In some embodiments, where a bit is used to indicate partial writing (see discussion of step 606), this bit may be cleared for the block in response to writing of dummy lines to the block. Accordingly, step 606 may be used to both detect partial writing and previous writing of dummy lines such that step 614 may be omitted.

If mitigation is not omitted according to any of the evaluations of steps 606-614, the method 600 may include finding 616 an acceptable fill percentage for the current PEC count of the block.

Step 616 may be preceded by finding a function or plot of FBC (maximum and average) for a plurality of fill percentages and a plurality of PEC counts. These values may be obtained by testing writing and reading to a unit of a type of NAND storage device at various fill percentages and PEC counts until the PEC count for the unit reaches the maximum PEC count for that type of NAND storage devices. The FBCs (maximum and average) for read data for some or all of the reads may be related to the fill percentage and current PEC when the data was read. FBCs may be measured for data read after predetermined retention time and a predetermine temperature, such as 125 hours at 66 66° C.

The manner in which the fill percentage for a given PEC count is calculated may be as follows. Let X % be the percentage of data filled in a partially written block, e.g., if 48 layers are written out of 96 layers, X=50%.

Let $LDPC_{ave}$ be the average FBC value (e.g., FBC per wordline) that is correctible using the low-density parity code (LDPC) correction capability that is used by the SSD controller 206 or other component of the storage system 200. This number may be dependent upon the correction capability of LDPC codes, NAND data characteristics, and quality of service (QoS) requirement from the host.

Let $LDPC_{max}$ be the maximum FBC value (e.g., FBC per wordline) allowed according to the LDPC algorithm used. $LDPC_{max}$ may be dependent upon the correction capability of LDPC codes, NAND data characteristics and QoS requirement from the host.

Let $FBC_{ave}$ (X,PEC) be the average FBC of all codewords in a partially written block with PEC program erase cycles and X % data filled. $FBC_{ave}$ (X,PEC) may be a function obtain as the result of the testing of a unit of the same type of NAND storage device as is used to store the block. The value output by $FBC_{ave}()$ for given values of X and PEC may be obtained by using a curve fit to the results of testing or by simply returning the measured average FBC during testing at a fill percentage and PEC closest to the values input to the function $FBC_{ave}()$.

$FBC_{max}$ (X,PEC) may be defined in a similar manner: the value output by $FBC_{ave}()$ for given values of X and PEC may be obtained by using a curve fit to the results of testing or by simply returning the measured maximum FBC during testing at a fill percentage and PEC closest to the values input to the function $FBC_{max}()$.

Using the following values, an average fill percentage $X^{PEC}_{ave}$ for a given PEC may be calculated as $X^{PEC}_{ave} = \text{argmin} \times FBC_{ave}(X,PEC) < LDPC_{ave}$. For example, $X^{PEC}_{ave}$ may be the smallest value of X for which $FBC_{ave}$ (X,PEC) is less than $LDPC_{ave}$.

Another constraint $X^{PEC}_{max}$ may be calculated as $X^{PEC}_{max} = \text{argmin} \times FBC_{max}(X,PEC) < LDPC_{max}$. For example, $X^{PEC}_{max}$ may be the smallest value of X for which $FBC_{max}$ (X,PEC) is less than $LDPC_{max}$.

For a given PEC, $X^{PEC}$ may then be set to $X^{PEC} = \max(X^{PEC}_{ave}, X^{PEC}_{max})$, i.e. the larger of $X^{PEC}_{ave}$ and $X^{PEC}_{max}$. The value of $X^{PEC}$ may therefore be used as the minimum allowed fill percentage of a partially written block with the PEC count of the partially written block that has an acceptable probability of meeting the constraint of $LDPC_{max}$.

The values of $X^{PEC}$ for a plurality of PEC counts, e.g. every 1000 PEC, or some other increment, may be precalculated and accessible to the component performing the method 600. Finding 616 the value of $X^{PEC}$ for the block according to the method 600 may include finding the value of $X^{PEC}$ corresponding to a PEC count that is higher than and closest to the current PEC for the block. Alternatively, the values of $X^{PEC}$ for PEC counts above and below the current PEC of the block may be used to estimate $X^{PEC}$ for the current count using linear interpolation, polynomial curve fitting, or other interpolation approach.

If the fill percentage of the block is found to be greater than $X^{PEC}$ as determined at step 616, then no mitigation is performed and shutdown 608 is allowed to proceed. If the fill percentage of the block is found to be equal to or below $X^{PEC}$ then mitigation may be performed. This may include programming 620 one or more dummy wordlines in the cells of the wordlines following the last written wordline of the block. The data in the wordlines may be random data that is read from a file of random values or generated each time dummy wordlines are written. The number of dummy wordlines may be selected based on the characteristics of the NAND storage device including the block. For example, there may be 1, 2, 3, 4, or more dummy wordlines programmed. Testing conducted by the inventor has found that four dummy wordlines are sufficient for some NAND storage devices. In some embodiments, the number of wordlines written is equal to the number of wordlines in each layer, which is four in the illustrated example but may be eight or some other value in other NAND storage devices.

For example, using the data from FIGS. 4A and 4B and assuming $LDPC_{ave}=150$, $LDPC_{max}=300$, and PEC=3000, one can find that $X^{PEC}_{ave}=10\%$, $X^{PEC}_{max}=25\%$, and $X^{PEC}=25\%$. For the same LDPC configuration and PEC=10,000, the data from FIGS. 4A and 4B gives $X^{PEC}_{ave}=50\%$, $X^{PEC}_{max}=100\%$, and $X^{PEC}=100\%$.

The evaluations of steps 606-614 and 616 are shown as being performed in a particular order. This order may be reordered in various other embodiments in order to reduce the number of evaluations and to avoid evaluations that require more processing. In some embodiments, only one type of cell (SLC, TLC, etc.) is used such that the evaluation of step 610 may be eliminated.

Table 1 illustrates an example layout of a block of a NAND storage device. Each wordline may include 16 KB of cells in each of multiple (e.g., 2) planes. Each cell of a wordline may store three bits (most significant bit (MSB), center significance bit (CSB), and least significant bit (LSB)). In the illustrated example, each layer has four wordlines. In Table 1, WD indicates written data, DD indicates dummy data, and UP indicates an unprogrammed wordline, which may include cells set to binary 0 or binary 1 depending on how the NAND storage device performs programming (selectively writing 1 or selectively writing 0). As is apparent in Table 1, the wordlines to which dummy data is written may be written to multiple layers.

TABLE 1

Example of Partially Written Data Block

| Layer 0 | Plane 0 | Plane 1 |
|---|---|---|
| Wordline 0 | WD | WD |
| Wordline 1 | WD | WD |
| Wordline 2 | WD | WD |
| Wordline 3 | WD | WD |

| Layer 1 | Plane 0 | Plane 1 |
|---|---|---|
| Wordline 0 | WD | WD |
| Wordline 1 | WD | WD |
| Wordline 2 | DD | DD |
| Wordline 3 | DD | DD |

| Layer 2 | | DD | DD |
|---|---|---|---|
| Wordline 0 | | DD | DD |
| Wordline 1 | | UP | UP |
| Wordline 2 | | UP | UP |
| Wordline 3 | | UP | UP |

Table 2 illustrates experimental results showing the benefit of the mitigation approach described herein. The listed values were measured for a PEC count of 7000 with a retention time of 125 hours at 66° C. As is readily apparent, below a fill percentage of 50 percent, there is a dramatic reduction in FBC when the mitigation approach described herein is used.

| Fill Percentage | Ave/Max FBC (No Mitigation) | Ave/Max FBC (With Mitigation) | Percentage Reduction (Ave/Max FBC) |
|---|---|---|---|
| 10 | 160/615 | 71/130 | 55/79 |
| 25 | 101/300 | 61/122 | 40/66 |

-continued

| Fill Percentage | Ave/Max FBC (No Mitigation) | Ave/Max FBC (With Mitigation) | Percentage Reduction (Ave/Max FBC) |
|---|---|---|---|
| 50 | 84/171 | 84/171 | 0/0 |
| 75 | 102/281 | 62/127 | 39/55 |

Figure 7A:
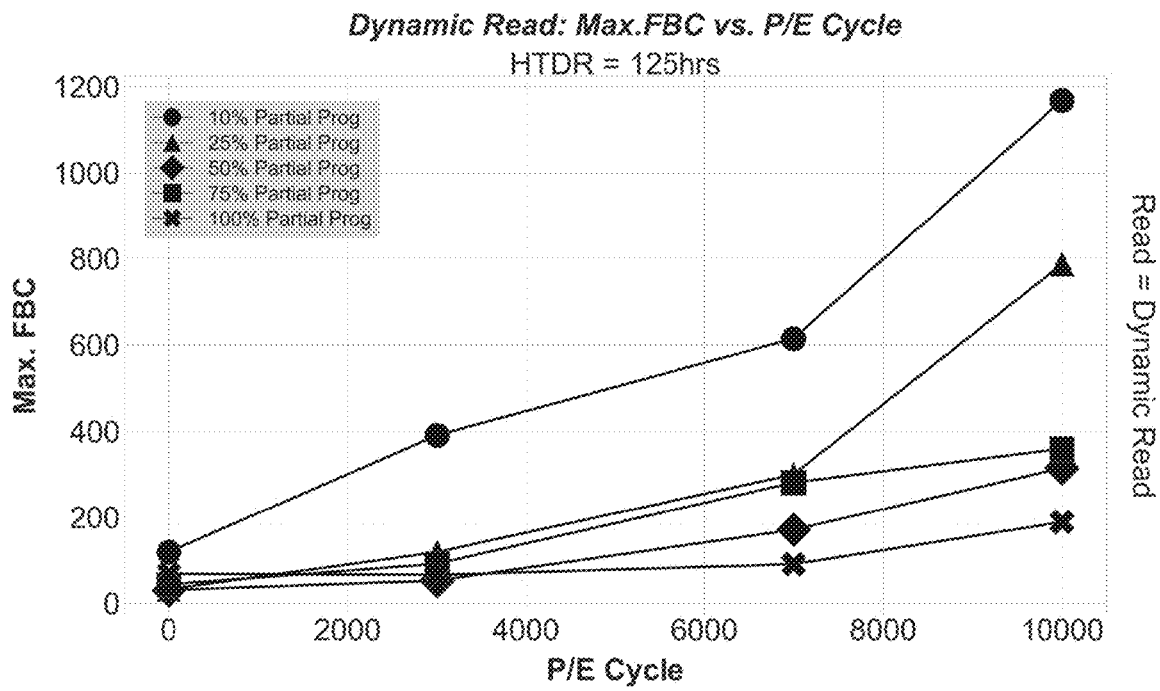
FIG. 7A is a plot showing maximum FBCs for various fill percentages at 125 hours of retention where the mitigation approach is not used.
Figure 7B:
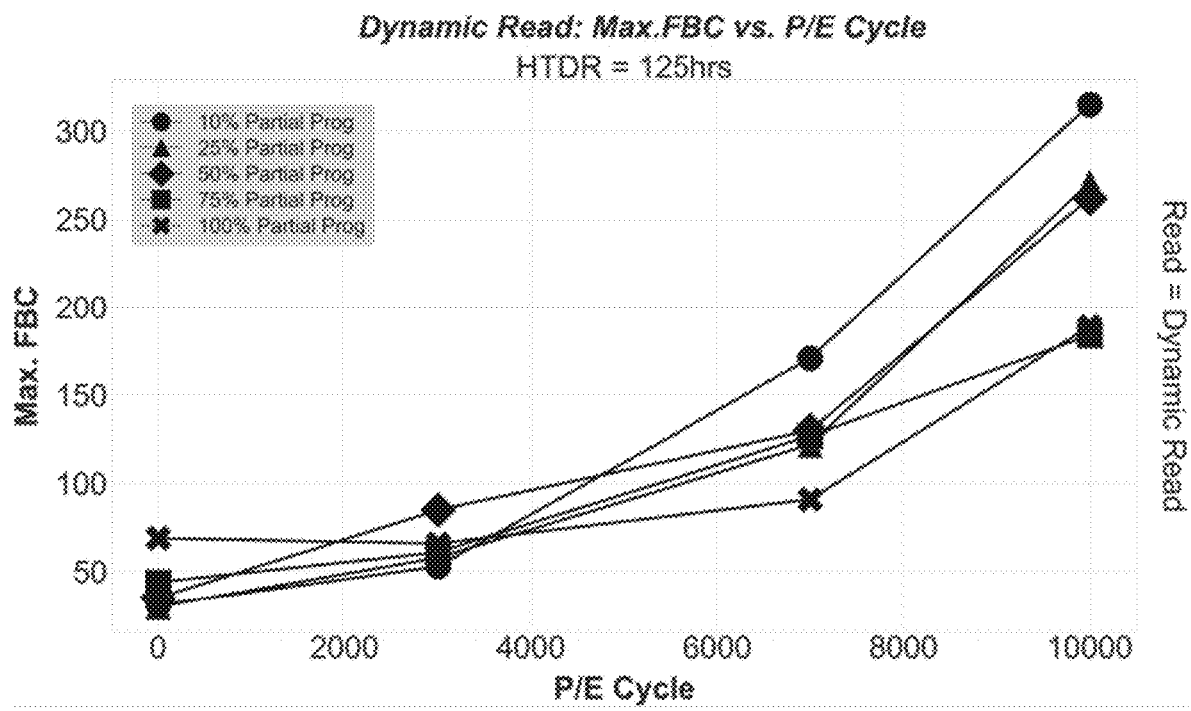
FIG. 7B is a plot showing maximum FBCs for various fill percentages at 125 hours of retention where the mitigation approach is used.

FIG. 7A illustrates measured maximum FBCs per word line for various PEC counts and fill percentages without the use of mitigation according to the method 600. FIG. 7B illustrates measured maximum FBCs per word line for various PEC counts and fill percentages with the use of mitigation according to the method 600. The measured FBCs of FIGS. 7A and 7B were measured after 125 hours of retention at 66° C. As is readily apparent, the mitigation approach of the method 600 achieved a nearly fourfold reduction in FBCs. As is also apparent, the reduction in FBCs is particularly dramatic for higher PEC s.

Figure 8:
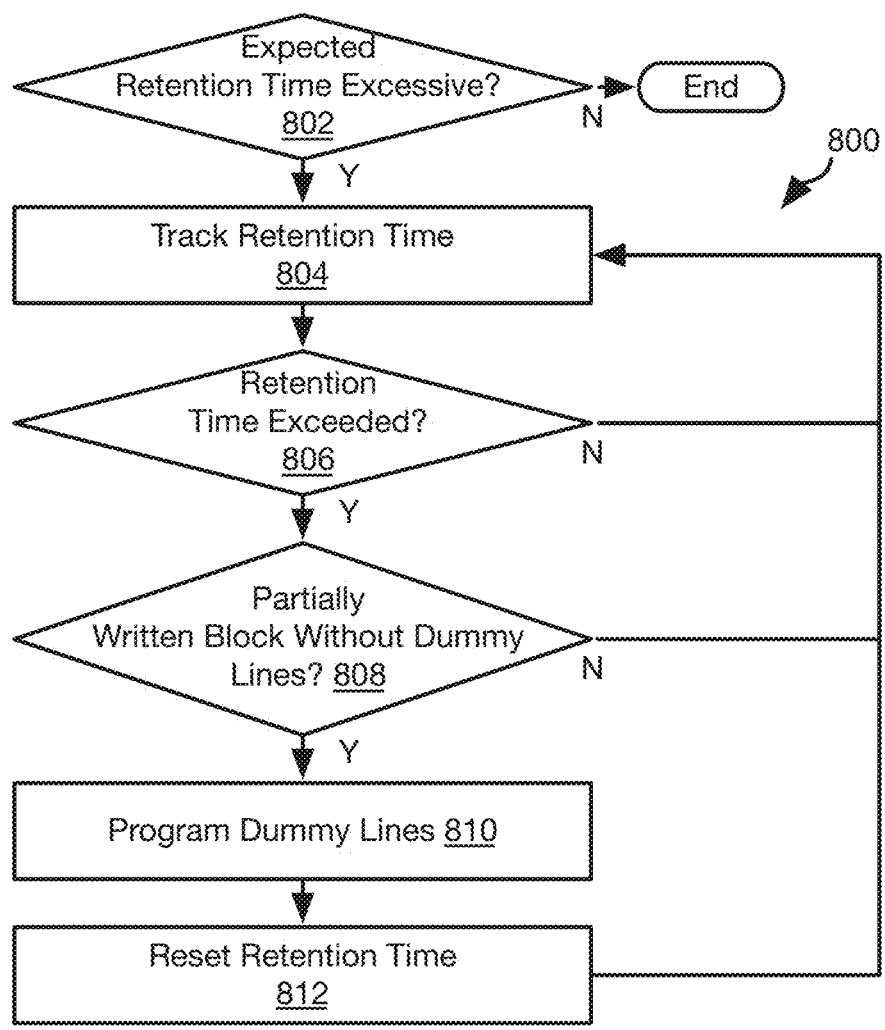
FIG. 8 is a process flow diagram of a mitigation approach performed during normal operation in accordance with an embodiment of the present invention.

Referring to FIG. 8, in the absence of a shutdown command, the method 800 may be used to mitigate edge layer errors due to long term retention of written data. For example, a block may be partially written during the regular use of the drive and never be filled due to lack of write data commands from the host. Accordingly, even in the absence of a shutdown command there may still be edge layer errors that may be reduced using mitigation.

The method 800 may include evaluating 802 an expected retention time ($H_w$) for the NAND flash memory 202 with respect to a maximum allowed retention time ($H_{allowed}$). In many persistent storage devices, such as for enterprises, a parameter may be maintained called the drive write per day (DWPD), which specifies how often the drive is fully written during a day. DWPD is closely coupled with the write amplification (WA) of the drive, where WA is the extra data written on the NAND compared to the host write request due to garbage collection. For example, if WA=4, a full host drive write will be effectively four drive writes on the NAND side. With this information, one can estimate average number of hours a block is completely written as $H_w$=24/(WA*DWPD) hours. For an enterprise drive, if WA=4 and DWPD=0.1, $H_w$=24/(4*0.1)=60 hours, which means a block is written completely on average every 60 hours during the normal operation of the drive.

By measuring retention data for a given type of NAND storage device, one can find allowed number of hours ($H_{allowed}$) which will be allowed for the short-term retention data in a partially written block. The value of $H_{allowed}$ will vary with respect to the PEC count of the block and the fill percentage of the block.

For example, for a given type of NAND storage device, values of $FBC_{ave}$ and $FBC_{max}$ may be measured across ranges of values of retention times (H), PEC counts (e.g., every 1000), and fill percentages X (e.g., in 5, 10, or 25 percent increments). A value $H_{ave}$(PEC,X) may be calculated as argmin $_H$ $FBC_{ave}$ (X,H,PEC)<$LDPC_{ave}$. A value $H_{max}$(PEC,X) may be calculated as $H_{max}$(PEC,X)=argmin× $FBC_{max}$ (X,H,PEC)<$LDPC_{max}$. $H_{allowed}$ (PEC, X) may then be calculated as min($H_{ave}$(PEC,X), $H_{max}$(PEC,X)).

If $H_w \leq H_{allowed}$ for the current PEC count and a predetermined fill percentage, e.g. 50 percent, then mitigation in the absence of a shutdown command may be omitted and the method 800 may end. If $H_w > H_{allowed}$, then mitigation may be performed. For example, the method 800 may include tracking 804 the retention time of each block of the NAND flash memory 200. The retention times of each block may be evaluated 806 to determine whether the retention time for the block exceeds $H_{allowed}$. If not, then tracking 804 continues. If so, the method 800 may include evaluating 808 whether the block is partially written. Step 808 may further include evaluating whether a partially written block has already had dummy lines written thereto due to a previous iteration of the method 600 or the method 800. Whether the block is partially written or has had dummy lines written thereto may be determined as described above with respect to the method 600. Whether a block is found 808 to be partially written may be determined by performing some or all of the evaluations 610-614, and 618 of the method 600. For example, the block may be deemed to be partially written if the conditions for performing step 620 are met as described above with respect to FIG. 6. In particular, the block may be found to be partially written if the fill percentage is less than $X^{PEC}$ for the current PEC of the block.

If the condition of step 808 is found to be met, then the method 800 may include programming 810 the block with one or more dummy lines. The writing of dummy lines may be performed as described above with respect to step 620, including where and how many lines are written. After the block has been programmed 810 with one or more dummy lines, the retention time for the block may be reset 812 to zero.

The present invention may be embodied in other specific forms without departing from its spirit or essential characteristics. The described embodiments are to be considered in all respects only as illustrative, and not restrictive. In particular, although the methods are described with respect to a NAND flash SSD, other SSD devices may also benefit from the methods disclosed herein. The scope of the invention is, therefore, indicated by the appended claims, rather than by the foregoing description. All changes which come within the meaning and range of equivalency of the claims are to be embraced within their scope.

What is claimed is:

1. A storage system comprising:
    a NAND storage device comprising a plurality of blocks of storage; and
    a controller coupled to the NAND storage device and programmed to:
        (a) identify one or more partially written blocks of the plurality of blocks of storage for which a written percentage of each block of the one or more partially written blocks is below a threshold percentage for each block of the one or more partially written blocks, the threshold percentage being a function of a number of program and erase cycles of each block of the one or more partially written blocks and being selected such that failed bit counts remain correctable according to error correction implemented by the NAND storage device; and
        (b) in response to the written percentage of each block of the one or more partially written blocks being below threshold, write one or more lines of dummy data to a layer following a last-written line of each block.

2. The storage system of claim 1, wherein the controller is further programmed to perform (a) by determining that the one or more partially written blocks are not single-level cells (SLC).

3. The storage system of claim 1, wherein the controller is further programmed to perform (a) by determining that a written percentage of each of the one or more partially written blocks is not equal to a predefined value.

4. The storage system of claim 1, wherein the controller is further programmed to perform (a) by determining that there has not been a previous writing of dummy data to the one or more partially written blocks.

5. The storage system of claim 1, wherein a number of the one or more lines of dummy data is equal to a number of wordlines in each layer of the NAND storage device.

6. The storage system of claim 5, wherein the one or more lines of dummy data include at least four lines.

7. The storage system of claim 1, wherein the NAND storage device is a three-dimensional NAND storage device.

8. The storage system of claim 1, wherein the controller is programmed to perform (a) and (b) in response to receiving a shut down command.

9. The storage system of claim 1, wherein the controller is programmed to perform (a) and (b) in response to determining that a maximum permitted retention time has elapsed for data written to the one or more partially written blocks.

10. A storage system comprising:
  a NAND storage device comprising a plurality of blocks of storage; and
  a controller coupled to the NAND storage device and programmed to:
    evaluate frequency of writing and write amplification of the NAND storage device;
    determining an expected retention time based on the frequency of writing and the write amplification of the NAND storage device; and
    if the expected retention time is greater than a maximum allowed retention time:
      track retention time of each block of the plurality of blocks of storage; and
      write dummy data to each block of the plurality of blocks having a retention time exceeding the maximum allowed retention time and that is determined to be partially written;
  wherein the controller is further programmed to determine whether each block of the plurality of blocks is partially written by determining that data written to each block is below a threshold percentage of a storage capacity of each block;
  wherein the threshold percentage is a function of a number of program and erase cycles of each block and is selected such that failed bit counts remain correctable according to error correction implemented by the NAND storage device.

11. The storage system of claim 10, wherein the expected retention time is a function of an amount of data written to the NAND storage device in a time period and write amplification of the NAND storage device.

12. The storage system of claim 10, wherein the controller is programmed to reset the retention time of each block following writing the dummy data thereto.

13. The storage system of claim 10, wherein the dummy data include at least four lines.

14. The storage system of claim 10, wherein the NAND storage device is a three-dimensional NAND storage device.

* * * * *